(12) United States Patent
Tatehara et al.

(10) Patent No.: US 7,046,706 B2
(45) Date of Patent: May 16, 2006

(54) LASER DIODE DRIVING DEVICE

(75) Inventors: Kenichi Tatehara, Takatsuki (JP);
Haruhiko Mizuno, Takatsuki (JP);
Norihide Kinugasa, Jouyou (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 259 days.

(21) Appl. No.: 10/719,435

(22) Filed: Nov. 21, 2003

(65) Prior Publication Data
US 2004/0125837 A1 Jul. 1, 2004

(30) Foreign Application Priority Data
Nov. 29, 2002 (JP) .............................. 2002-347127

(51) Int. Cl.
*H01S 3/00* (2006.01)
*H01S 3/30* (2006.01)

(52) U.S. Cl. .............................. 372/38.02; 372/38.03; 372/38.04; 372/38.07

(58) Field of Classification Search ............. 372/38.02, 372/38.03, 38.04, 38.07
See application file for complete search history.

(56) References Cited

U.S. PATENT DOCUMENTS 4,806,873 A * 2/1989 Nagano ....................... 359/333
4,835,780 A 5/1989 Sugimura et al.
2003/0086456 A1* 5/2003 Tatehara et al. ......... 372/38.02

FOREIGN PATENT DOCUMENTS

JP 63-143887 6/1988

* cited by examiner

*Primary Examiner*—Minsun Harvey
*Assistant Examiner*—Ernest Unelus
(74) *Attorney, Agent, or Firm*—Hamre, Schumann, Mueller & Larson, P.C.

(57) ABSTRACT

A laser diode driving device of the present invention can appropriately shorten the rising time and the falling time of a laser diode drive current in a range from a small current region to a large current region. In synchronization with the addition of an original input current from an input constant current source to the laser diode drive current amplifier, a differentiated current is added to the input current through a differentiation circuit and a pull-in type V-I conversion circuit, whereby the rising of a laser diode drive current is made abrupt. Furthermore, by increasing a gate potential of an input PchMOS transistor constituting the laser diode drive current amplifier by a differentiation circuit and a push-out type V-I conversion circuit in synchronization with the disconnection of an input current, the falling of a laser diode drive current is made abrupt.

7 Claims, 4 Drawing Sheets

LASER DIODE DRIVING DEVICE

BACKGROUND OF THE INVENTION

1. Field of the Invention

The present invention relates to a laser diode driving device for an optical disc.

2. Description of the Related Art

FIG. 4 shows an example of a conventional laser diode driving device (e.g., see JP 63 (1988)-143887 A). In FIG. 4, an input PchMOS transistor 105 constituting a mirror circuit of a PchMOS transistor is connected to a pull-in type constant current source 103 through a switch 104, and an output PchMOS transistor group 106 constituting the mirror circuit of the PchMOS transistor 105 is connected to a laser diode 107.

When the switch 104 is closed, an output current that is a gain-fold of the mirror circuit flows to the laser diode 107. On the other hand, when the switch 104 is opened, the output current flowing to the laser diode 107 stops flowing.

However, with the above-mentioned conventional configuration, the following problems arise.

In general, the drive current of a laser diode is large. Therefore, the size of the output PchMOS transistor group 106 constituting the mirror circuit of the PchMOS transistor is large. Because of this, the gate capacitance of the PchMOS transistor is large, which makes it impossible to decrease a gate potential abruptly when the switch 104 is closed. Consequently, the rising time of the drive current of the laser diode 107 is long. Furthermore, when an input current is decreased so as to adjust a light-emission power of the laser diode 107, the rising time of the drive current of the laser diode 107 is long. In contrast, when the switch 104 is opened, the gate potential does not rise abruptly, so that the falling time of the drive current of the laser diode 107 is long.

Recently, the storage capacity of an optical disc is increasing. In order to further increase the storage capacity in such a situation, it is necessary to shorten the rising time and falling time of a drive current of a laser diode. However, the difficulty in accomplishing this makes it difficult to increase the storage capacity of an optical disc in the above-mentioned conventional laser diode drive device.

SUMMARY OF THE INVENTION

Therefore, with the foregoing in mind, it is an object of the present invention to provide a laser diode driving device that enables an abrupt rising time and falling time of a drive current of a laser diode.

A laser diode driving device of the present invention includes an input constant current source, a switch, and a laser diode drive current amplifier. The laser diode driving device of the present invention further includes a first differentiation circuit that differentiates a control signal of the switch, a first voltage (V)-current (I) conversion circuit that receives an output signal from the first differentiation circuit and outputs a current with the same polarity as that of the input constant current source; a second differentiation circuit that differentiates a signal with a polarity opposite to that of the control signal of the switch; and a second V-I conversion circuit that receives an output signal from the second differentiation circuit and outputs a current with a polarity opposite to that of the input constant current source.

This enables an abrupt rising time and an abrupt falling time of a drive current of a laser diode.

These and other advantages of the present invention will become apparent to those skilled in the art upon reading and understanding the following detailed description with reference to the accompanying figures.

DESCRIPTION OF THE PREFERRED EMBODIMENTS

Hereinafter, the present invention will be described by way of an illustrative embodiment with reference to the drawings.

Figure 1:
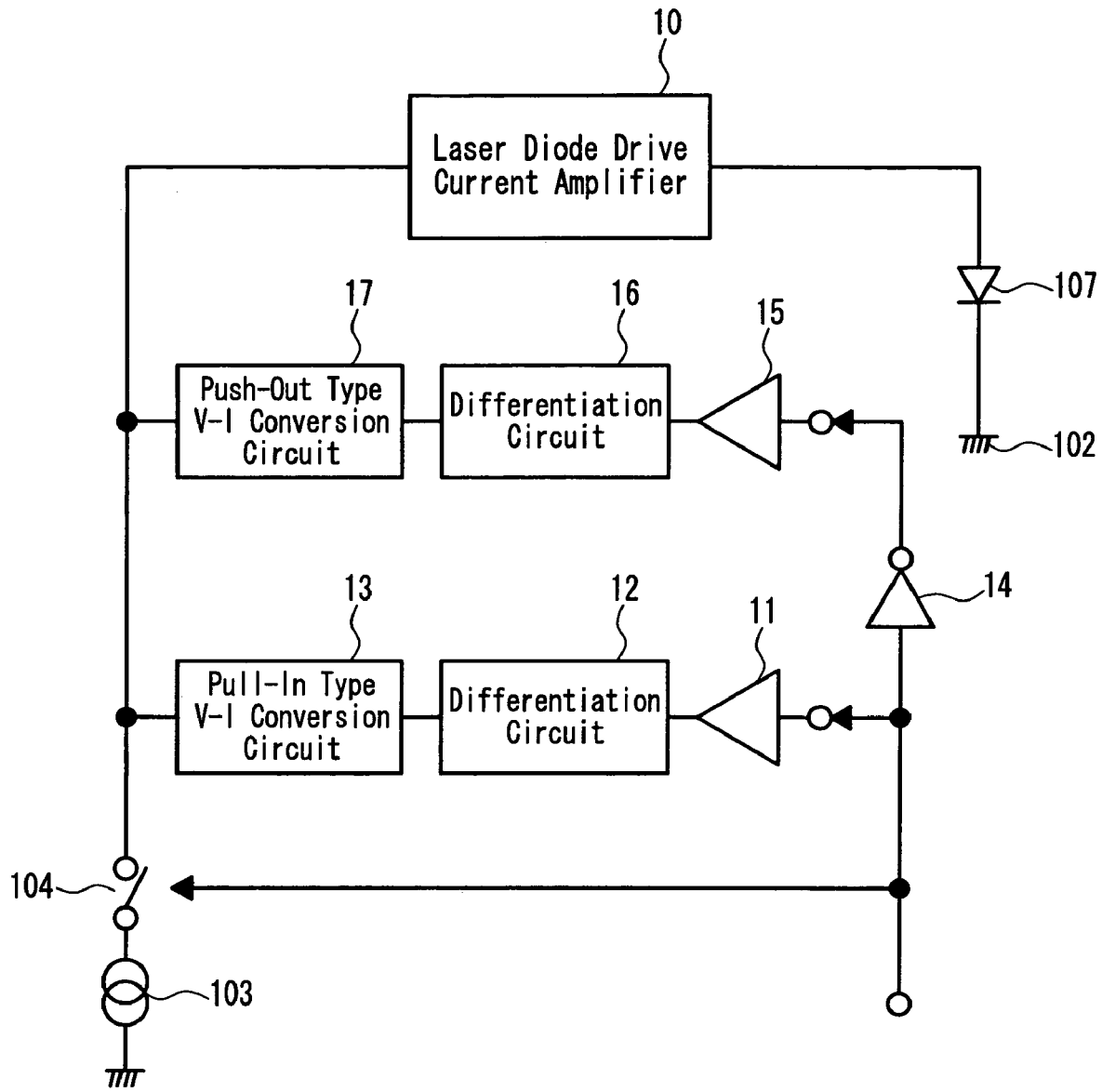
FIG. 1 is a circuit diagram showing a basic configuration of a laser diode driving device according to one embodiment of the present invention.
Figure 4:
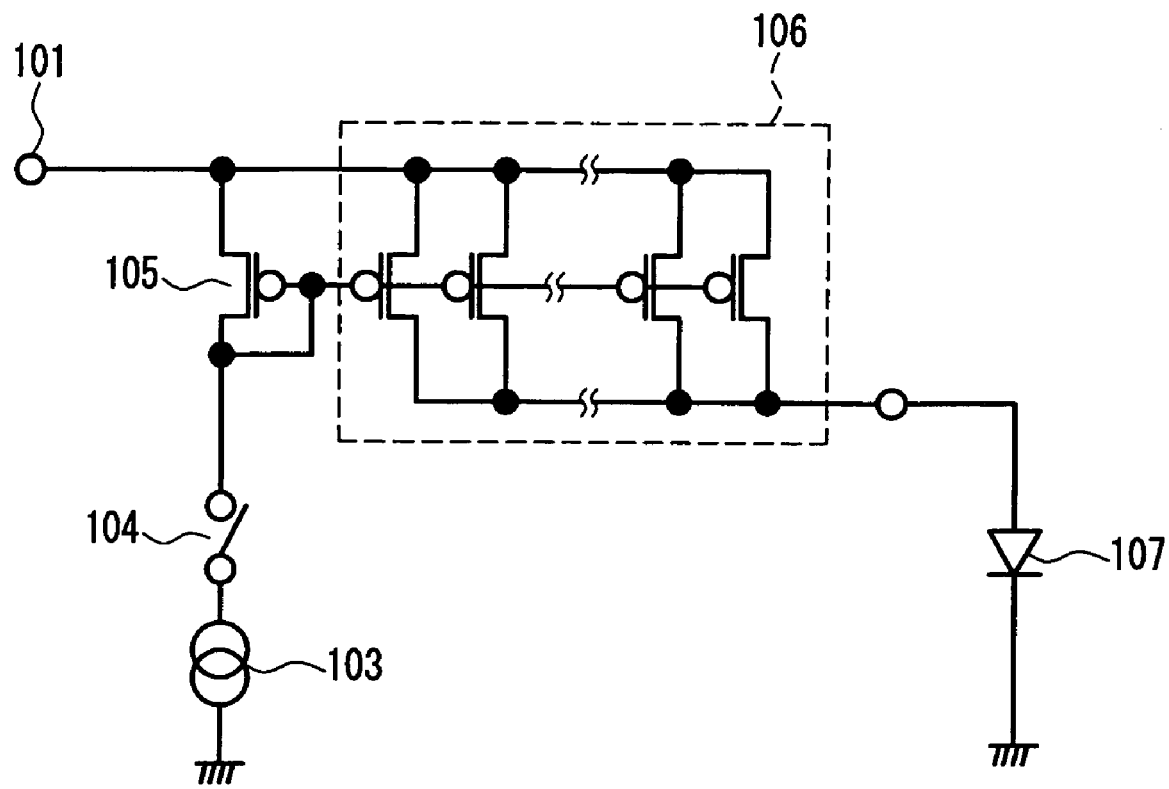
FIG. 4 is a circuit diagram of a conventional laser diode driving device.

FIG. 1 is a circuit diagram showing a basic configuration of a laser diode driving device according to one embodiment of the present invention. In FIG. 1, portions having the same configurations and functions as those in the conventional example shown in FIG. 4 are denoted with the same reference numerals as those therein. Reference numeral 10 denotes a laser diode drive current amplifier, 11, 15 denote driving circuits, 12, 16 denote differentiation circuits, 13 denotes a pull-in type V-I conversion circuit, 17 denotes a push-out type V-I conversion circuit, and 14 denotes an inverting circuit.

In the above-mentioned circuit configuration, when a switch 104 is closed, a current of an input constant current source 103 is input to the laser diode drive current amplifier 10. A control signal of the switch 104 is differentiated by the differentiation circuit (first differentiation circuit) 12 via the driving circuit 11, is input to the V-I conversion circuit (first V-I conversion circuit) 13 that outputs a current with the same polarity as that of the input constant current source 103, and its output current is input to the laser diode drive current amplifier 10 as a differentiated current in a pull-in direction. Consequently, the rising of the laser diode drive current becomes abrupt.

On the other hand, when the switch 104 is opened, the current of the input constant current source 103 stops flowing to the laser diode drive current amplifier 10. The control signal of the switch 104 is differentiated by the differentiation circuit (second differentiation circuit) 16 via the driving circuit 15, is input to the V-I conversion circuit (second V-I conversion circuit) 17 that outputs a current with a polarity opposite to that of the input constant current source 103, and its output current is input to the laser diode drive current amplifier 10 as a differentiated current in a push-out direction. Consequently, the laser diode drive current amplifier 10 is turned off abruptly, whereby the falling of the laser diode drive current becomes abrupt.

Figure 2:
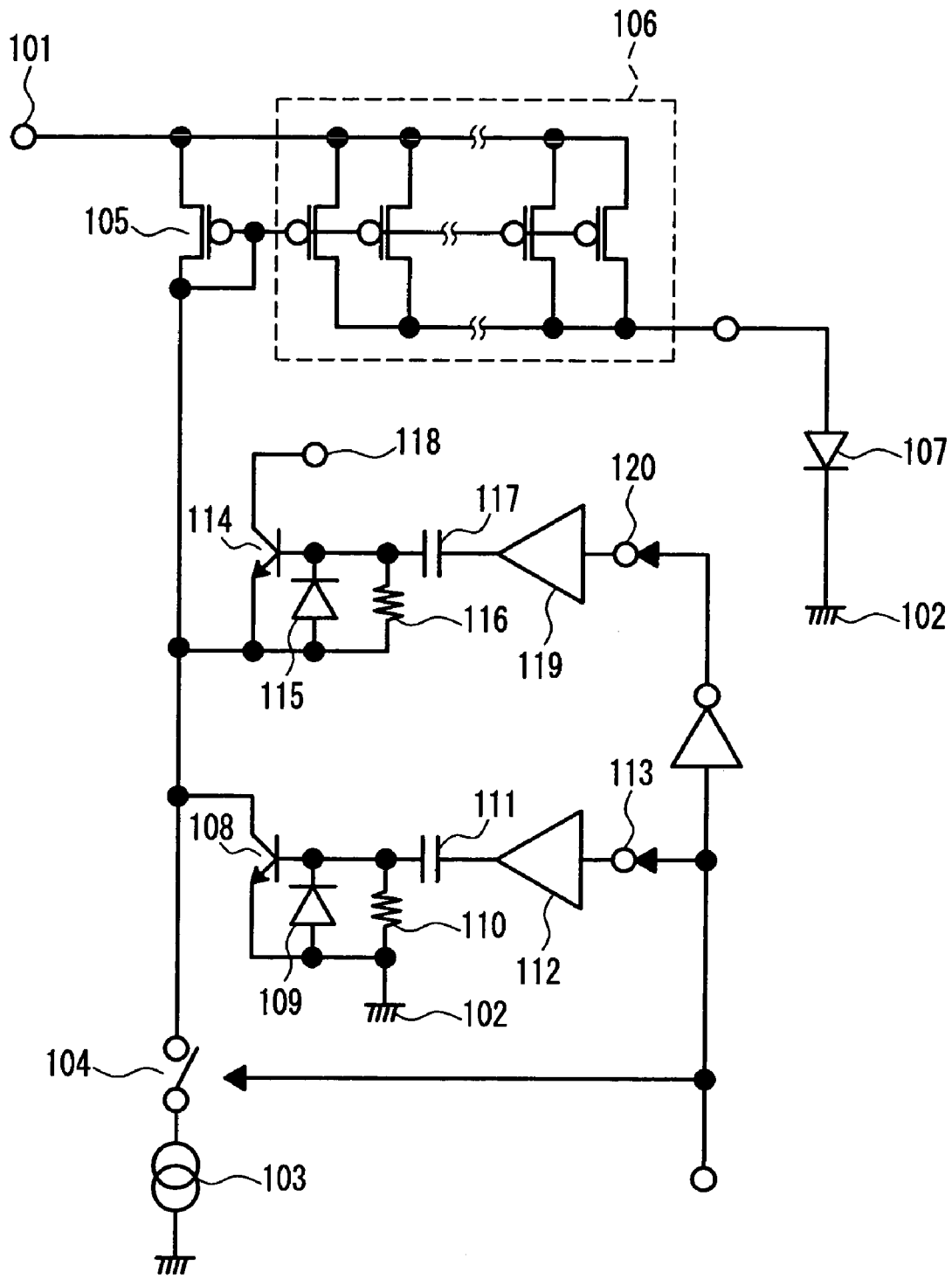
FIG. 2 is a circuit diagram to illustrate further the circuit in FIG. 1.

FIG. 2 is a circuit diagram to illustrate further the circuit in FIG. 1. As shown in FIG. 2, the driving circuit 11, the differentiation circuit 12, and the V-I conversion circuit 13 shown in FIG. 1 include a NPN transistor 108 and a driving circuit 112. A collector of the NPN transistor 108 is connected to an input terminal of the input PchMOS transistor 105 constituting the mirror circuit of the PchMOS transistor, an emitter thereof is grounded, and a base thereof is connected to one electrode of a capacitor 111. An output terminal of a driving stage in the driving circuit 112 is connected to the other electrode of the capacitor 111.

In the above configuration, when the switch 104 is closed, an input terminal of the driving circuit 112 is turned to be a "High" level. The NPN transistor 108 is supplied with a base current as a differentiated current through a capacitor 111, whereby the NPN transistor 108 is turned on. A collector current of the NPN transistor 108 is added to an original input current of the pull-in type constant current source 103 as a differentiated current, and the mirror circuit of the PchMOS transistor is turned on abruptly. Thus, the driving current of the laser diode 107 can rise abruptly.

Furthermore, by providing a resistor 110, excess charge of the NPN transistor 108 can be discharged to the ground, whereby more differential current addition can be performed. Furthermore, by providing a diode 109, when the input terminal 113 is turned to be a "Low" level, a base potential of the NPN transistor 108 can be clamped.

Still furthermore, the driving current 15, the differentiation circuit 16, and the V-I conversion circuit 17 include a NPN transistor 114 and a driving circuit 119. An emitter of the NPN transistor 114 is connected to an input terminal of the input PchMOS transistor 105 constituting the mirror circuit of the PchMOS transistor, a collector thereof is connected to a power source terminal 118, and a base thereof is connected to one electrode of the capacitor 117. An output terminal of a driving stage in the driving circuit 119 is connected to the other electrode of the capacitor 117.

In the above-mentioned configuration, when the switch 104 is opened, an input terminal of the driving circuit 119 is turned to be a logic "H" level. The NPN transistor 114 is supplied with a base current as a differentiated current through the capacitor 117, whereby the NPN transistor 114 is turned on. An emitter current of the NPN transistor 114 abruptly increases a gate potential of the input PchMOS transistor 105 constituting the mirror circuit of the PchMOS transistor, and the mirror circuit of the PchMOS transistor is turned off abruptly. Consequently, the driving current of the laser diode 107 can fall abruptly.

Furthermore, by providing a resistor 116, excess charge of the NPN transistor 114 can be discharged, whereby more differential increase in a gate potential can be performed. Furthermore, by providing a diode 115, when the input terminal 120 is turned to be a "Low" level, a base potential of the NPN transistor 114 can be clamped.

Figure 3:
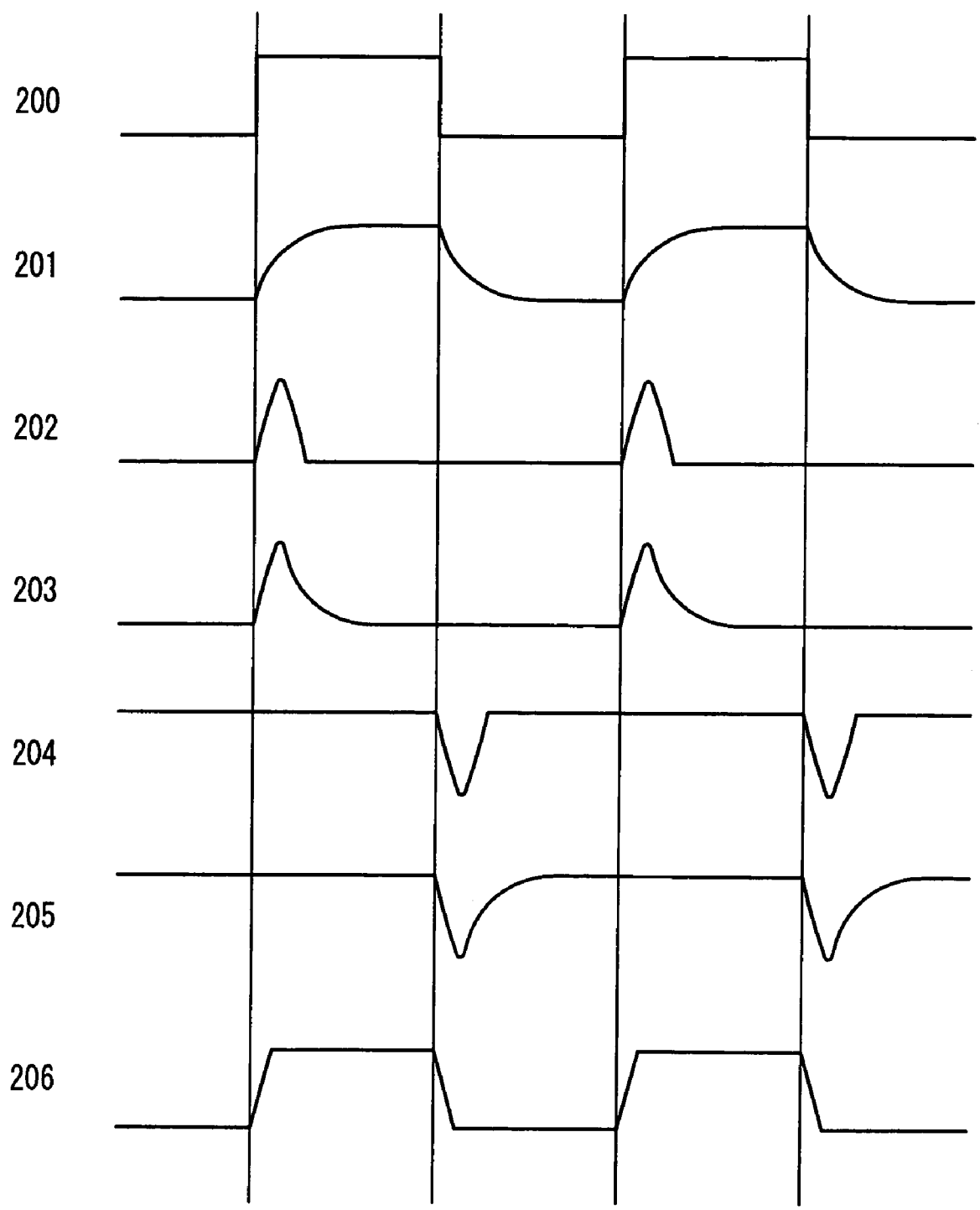
FIG. 3 is a timing chart of a signal waveform of each portion in the circuit shown in FIG. 1

FIG. 3 is a timing chart showing a signal waveform of each portion in the circuit shown in FIG. 1. In FIG. 3, reference numeral 200 denotes a control signal waveform of the switch 104, 201 denotes an input current waveform of the laser diode drive current amplifier 10, 202 denotes an output voltage waveform of the differentiation circuit 12, 203 denotes an output current waveform of the pull-in type V-I conversion circuit 13, 204 denotes an output voltage waveform of the differentiation circuit 16, 205 denotes an output current waveform of the push-out type V-I conversion circuit 17, and 206 denotes a laser diode drive current waveform.

In the above embodiment, the configuration using the mirror circuit of the PchMOS transistor and the NPN transistor have been illustrated and mentioned. However, it is apparent that the same effects can be obtained even in the configuration using the mirror circuit of the NchMOS transistor and the PNP transistor.

Thus, according to the present embodiment, a current is added differentially in synchronization with the addition of an original input current to an amplifier of an input current, whereby the rising time of a laser diode drive current is shortened. Furthermore, by differentially increasing a gate potential of an input PchMOS transistor constituting a mirror circuit of a transistor in synchronization with the disconnection of an input current, the falling time of a laser diode drive current can be shortened.

As described above, according to the present invention, the rising time and the falling time of a laser diode drive current can be shortened in a range from a small current region to a large current region of the laser diode drive current.

The invention may be embodied in other forms without departing from the spirit or essential characteristics thereof. The embodiments disclosed in this application are to be considered in all respects as illustrative and not limiting. The scope of the invention is indicated by the appended claims rather than by the foregoing description, and all changes which come within the meaning and range of equivalency of the claims are intended to be embraced therein.

What is claimed is:

1. A laser diode driving device, comprising:
   a constant current source;
   a switch with one end connected to the constant current source;
   a laser diode drive current amplifier with an input terminal connected to the other end of the switch and an output terminal connected to a laser diode;
   a first differentiation circuit that differentiates a control signal for controlling the switch to be either on or off; and
   a first voltage-current conversion circuit that outputs a current having the same polarity as that of the constant current source when the switch is turned on, in which an input terminal is connected to an output terminal of the first differentiation circuit, and an output terminal is connected to an input terminal of the laser diode drive current amplifier.

2. The laser diode driving device according to claim 1, further comprising:
   a second differentiation circuit that differentiates the control signal; and
   a second voltage-current conversion circuit that outputs a current having a polarity opposite to that of the constant current source when the switch is turned off in which an input terminal is connected to an output terminal of the second differentiation circuit, and an output terminal is connected to an input terminal of the laser diode drive current amplifier.

3. The laser diode driving device according to claim 1, wherein the laser diode driving current amplifier is composed of a mirror circuit of a PchMOS transistor.

4. The laser diode driving device according to claim 1, wherein the first differentiation circuit includes a capacitor at an output terminal.

5. The laser diode driving device according to claim 2, wherein the second differentiation circuit includes a capacitor at an output terminal.

6. The laser diode driving device according to claim 1, wherein the first voltage current conversion circuit includes:
   a first resistor with one end connected to an output terminal of the first differentiation circuit and the other end grounded;
   a first diode with a cathode connected to an output terminal of the first differentiation circuit and an anode grounded; and
   a first transistor with a base connected to the output terminal of the first differentiation circuit, an emitter grounded, and a collector connected to the input terminal of the laser diode drive current amplifier.

7. The laser diode driving device according to claim 2, wherein the second voltage-current conversion circuit includes:
   a second resistor with one end connected to an output terminal of the second differentiation circuit;
   a second diode with a cathode connected to an output terminal of the second differentiation circuit; and
   a second transistor with a base connected to the output terminal of the second differentiation circuit, a collector connected to a power supply terminal, and an emitter connected to the input terminal of the laser diode drive current amplifier together with the other end of the second resistor and an anode of the second diode.

* * * * *